United States Patent
Wu

(10) Patent No.: US 6,187,619 B1
(45) Date of Patent: Feb. 13, 2001

(54) METHOD TO FABRICATE SHORT-CHANNEL MOSFETS WITH AN IMPROVEMENT IN ESD RESISTANCE

(76) Inventor: Shye-Lin Wu, No. 6, Creation Rd. 2, Science-Based Industrial Park, Hsinchu (TW)

( * ) Notice: Under 35 U.S.C. 154(b), the term of this patent shall be extended for 0 days.

(21) Appl. No.: 09/288,948

(22) Filed: Apr. 9, 1999

Related U.S. Application Data

(63) Continuation-in-part of application No. 09/024,772, filed on Feb. 17, 1998, now Pat. No. 5,920,774.

(51) Int. Cl.[7] .................................................. H01L 21/8238
(52) U.S. Cl. ............................ 438/224; 438/234; 438/238
(58) Field of Search ......................... 438/224, 234, 438/238, 203, 207, 197, 199, 659, 766, 200, 682

(56) References Cited

U.S. PATENT DOCUMENTS

| | | | |
|---|---|---|---|
| 4,907,048 | * 3/1990 | Hunag | 357/23.9 |
| 5,386,134 | * 1/1995 | Huang | 257/630 |
| 5,516,717 | * 5/1996 | Hsu | 437/56 |
| 5,920,774 | * 7/1999 | Wu | 438/224 |
| 6,063,706 | * 5/2000 | Wu | 438/682 |
| 6,069,031 | * 5/2000 | Wu | 438/197 |

* cited by examiner

*Primary Examiner*—Amir Zarabian
*Assistant Examiner*—Michael S. Lebentritt
(74) *Attorney, Agent, or Firm*—Harness, Dickey & Pierce, P.L.C.

(57) ABSTRACT

A method to fabricate simultaneously a MOS transistor and an ESD protective transistor in a silicon substrate is disclosed. The ESD protective devices are fabricated with a double diffused drain (DDD) junction. In the functional region, a MOSFET structure is characterized as having an anti-punchthrough region beneath the poly-gate, LDD regions beneath sidewall spacers and a silicide layer on the source/drain and the poly-gate. In addition, the n+p junction are ultra shallow. Furthermore, the invention utilizes a liquid phase deposition (LPD) oxide layer to serve as a hard mask for the spacer forming process, salicide process and the S/D implant so as to simplify the fabricating process.

18 Claims, 5 Drawing Sheets

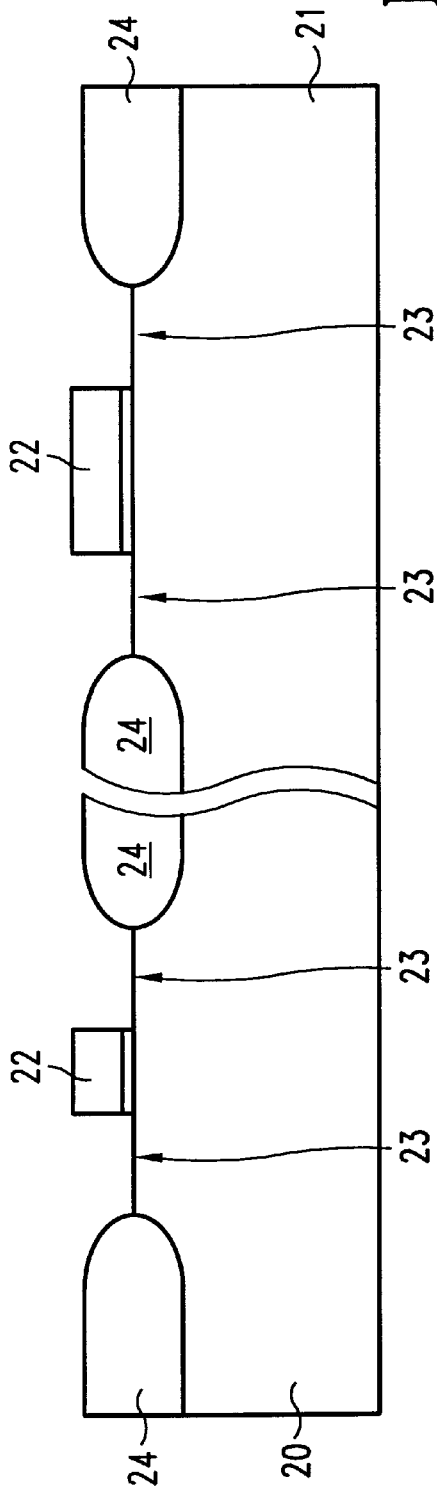
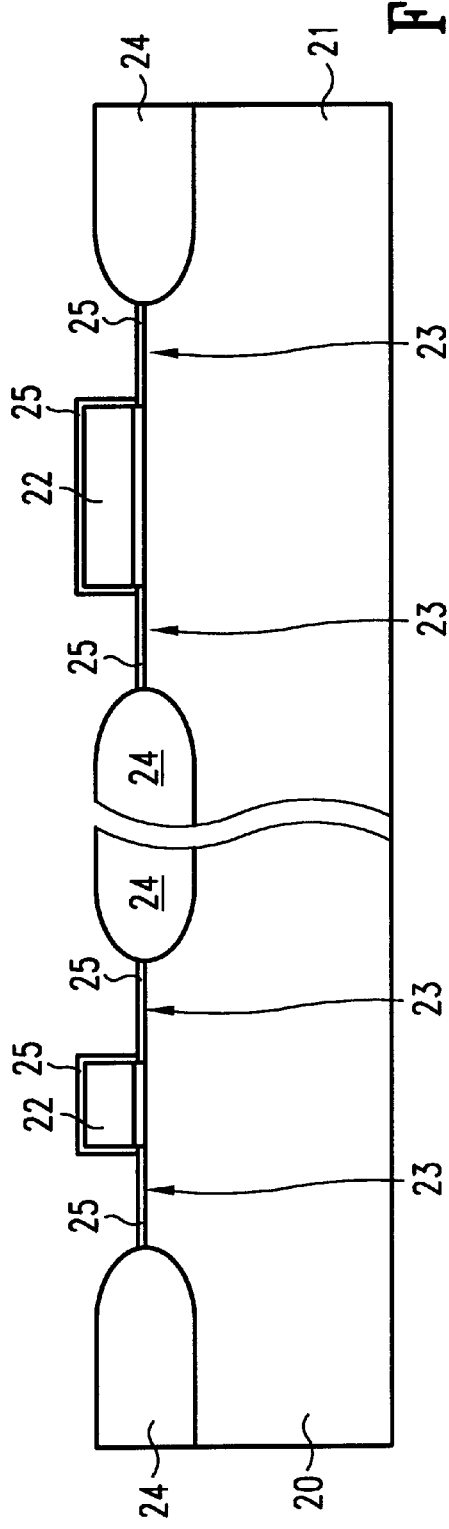

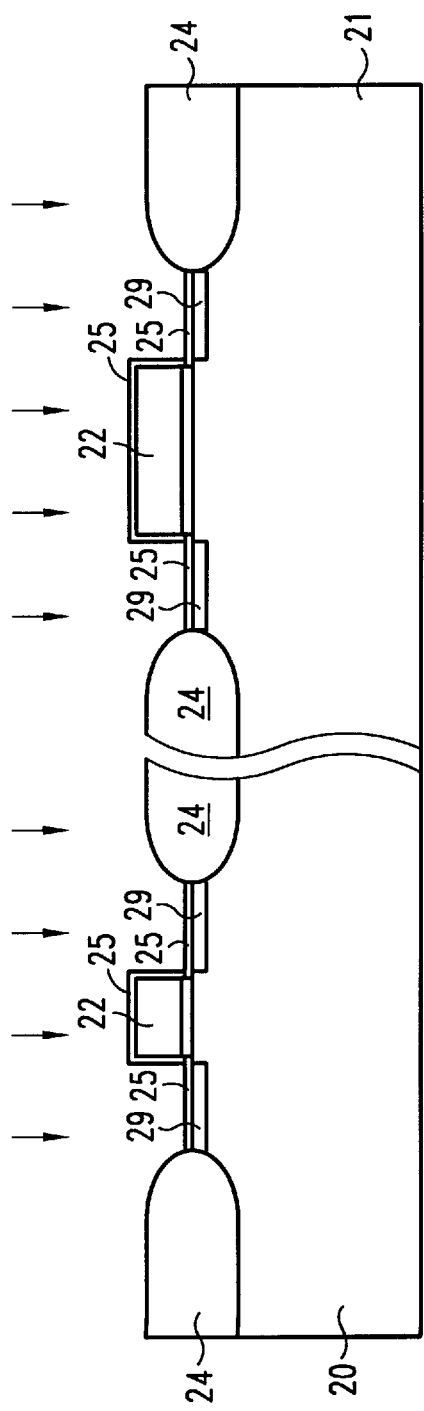
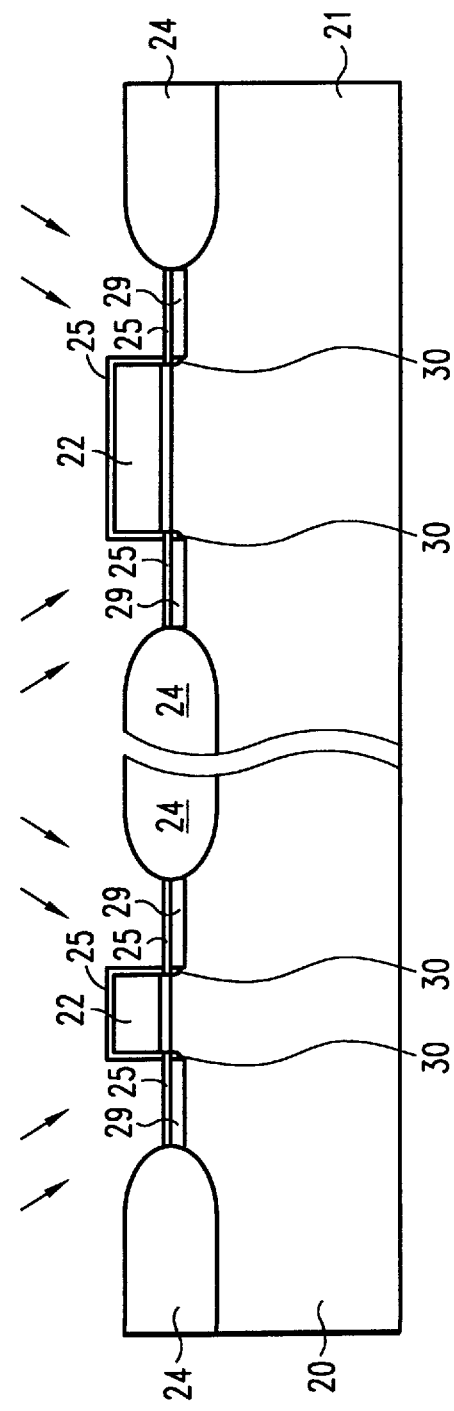

METHOD TO FABRICATE SHORT-CHANNEL MOSFETS WITH AN IMPROVEMENT IN ESD RESISTANCE

CROSS-REFERENCE TO RELATED APPLICATIONS

The invention is a continuation-in-part of the application filed on Feb. 17, 1998, Ser. No. 09/024,772 now U.S. Pat. No. 5,920,774 under the same title assigned to the same assignee.

FIELD OF THE INVENTION

The present invention pertains to a semiconductor device process, and more specifically, to a method of fabricating short-channel MOSFETs with an improvement in ESD resistance.

BACKGROUND OF THE INVENTION

In the 1990s, the beginning of the ULSI era, the most important factor achieving the ULSI complexity has been the continued reduction of the minimum device-feature length (gate, source and drain regions in MOS devices). The reduction in feature length and related dimensions has resulted in promoting the rapid growth in the number of components per MOSFET chip (the unit cost per functional reduction), and improving of device speed (which varies inversely approximately with the square of feature length).

However, as a device is scaled from one micron down to submicron size or beyond, it may suffer more stringent problems. For example, hot carriers effect and punchthrough effect are two of the major constraints in CMOS transistor scaling. Further, parasitic resistance and capacitance in the scaled device structure must be avoided.

Another limiting factor for devices with submicron dimensions is the conductivity of the source/drain regions and the poly-gate. For example, the sheet resistance of diffusion regions increases from 25 Ω/sq—in a 1 μm technology to 50 Ω/sq—in a 0.5 μm technology. A self-aligned silicide technology, namely salicide, has been developed which involves the formation of silicide on poly-gate, source and drain contact simultaneously. The salicide process can provide not only low-sheet resistance for S/D regions and for gate electrodes in MOS devices but also a very clean suicide-silicon interface. Further, it does not require any additional lithography and etching. In addition, the alignment was predetermined.

Another critical issue accompanying the feature size of MOSFET scale down and degrading significantly the device performance may be the electrostatic discharge (ESD). The ESD may be easily conducted through the input/output and power lead connections into the internal devices to destroy the devices. For example, a high voltage can be accidentally applied to the pins of the IC package by a person while handling, and causing the breakdown of the gate oxide of the devices. Thus, it is imperative that a built-in protective ESD circuitry is formed simultaneously with the transistor.

However, silicided S/D regions and the LDD structures can degrade the ESD performance of the gate-controlled breakdown structure. As a result, the ESD protection structures can be rendered largely ineffective by the silicided process. Chen proposed that [S]hallower junctions and thicker salicide have a negative impact on the ESD capability of a process, as set forth in an article appearing at page 212 of the Proceeding of the EOS/ESD Symposium (1988).

In an article appearing at page 893 of the IEDM Technical Digest (1996), Amerasekera et al., investigated the relationship between the current gain β of a self-biased lateral NPN (parasitic bipolar in a NMOS) transistor and ESD performance, and found that devices with lower β are observed to have lower ESD performance. Further, the authors also suggested that β is found to be strongly influenced by the effective drain/source diffusion depth below the salicide which is determined by the implant energy as well as by the amount of active diffusion consumed in silicidation. Thus, it is essential to develop a salicide process with an BSD preventive circuitry and the ULSI devices being fabricated at the same time giving the least influence on the ESD performance.

On the other hand, as linewidths are narrowed to submicron size, the lithography also becomes a limiting factor. For example, decreasing the wavelength ($\lambda$) of the optical source and increasing numerical aperture (NA) are logical approaches to improve resolution. However, decreased the depth of focus (DOF). See the equation (set forth in the reference by C. Y. Chang and S. M. Sze titled "ULSI technology", McGraw-Hill Book Co., p. 270 (1996).

$$DOF = \pm \lambda/2(NA)^2$$

The DOF corresponds to the height of the largest window or equivalently to the height of the photoresist. It is, therefore, essential to decrease the number of lithography or to find an effective mask formed at a lower temperature and with minimum thickness that can block the unwanted ions during implanting. A liquid phase deposition (LPD) oxide layer is one of the best candidates that can satisfy such conditions.

The LPD technology as suggested by Homma et al; in J. Electrochem. Soc. 140, p. 2410 (1993), utilizes supersaturated hydrofluosilicic acid and $H_2HiF_6$ aqueous as a source liquid. The LPD-$SiO_2$ layers can be selectively formed on CVD $SiO_2$ underlayers in the trenches between photoresist patterns or tungsten wiring with photoresist as a mask without destroying the photoresist. Besides, the lower reaction temperature is required for forming LDP-$SiO_2$ layers. Other benefits obtained from the LPD-$SiO_2$ layers include that it can more effectively prevent ions from penetrating the oxide layer than through the photoresist during ion implantation. Thus, no additional mask is needed.

SUMMARY OF THE INVENTION

The invention discloses a method for fabricating a MOS transistor and an ESD protective transistor in a silicon substrate formed simultaneously. The method comprises the following steps: At first, a conventional method is done to form isolation regions, a first poly-gate in the functional region, and a second poly-gate in an ESD region. After that, a first insulating layer is on all resulting surfaces formed to recover the damage. Then a first ion implantation is performed to all resulting surfaces using n-type conductive ions so as to form a first lightly doped drain (LDD) region in the functional region and a second LDD region in the ESD region. Subsequently, a second ion implantation with a large tilted angle is implemented to all resulting surfaces using p-type conductive ions to form a first anti-punchthrough region beneath the first poly-gate and a second anti-punchthrough region beneath said second poly-gate. After a photoresist layer masks the functional region, a third ion implantation with a tilted angle is conducted to the ESD protective region by using two n-type conductive ions co-implanted so as to form a double diffusion drain in ESD protective region. A LPD oxide is then successively formed on the second ESD protective region using the photoresist layer as a mask. The LPD layer serves as a hard mask to the subsequent processes. After stripping the photoresist layer, oxide spacers are formed on the sidewall of the first poly gate. A salicide process is then subsequently performed to form the silicide layer on the S/D region of the functional region. After that, a low energy, heavily doped ion implant into the silicide layer is undertaken so that a diffusion source is formed. After a thick oxide layer is formed on all surfaces, a high temperature thermal annealing is then conducted to recover the damage, activate the conductive ions, and form an ultra shallow junction in the functional region as well as the DDD junction in the ESD region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a silicon substrate with a poly gate structure on both the functional region and the ESD protective region according to the prior art;

FIG. 2 is a cross-sectional view of a silicon substrate with silicon oxy-nitride on all surfaces, according to the present invention;

FIG. 3 is a cross-sectional view of the step of LDD ion implantation on all surfaces according to the present invention;

FIG. 4 is a cross-sectional view of performing a large-angle pocket antipunchthrough ion implantation according to the present invention;

DETAILED DESCRIPTION OF THE PREFERRED EMBODIMENT

Figure 5:
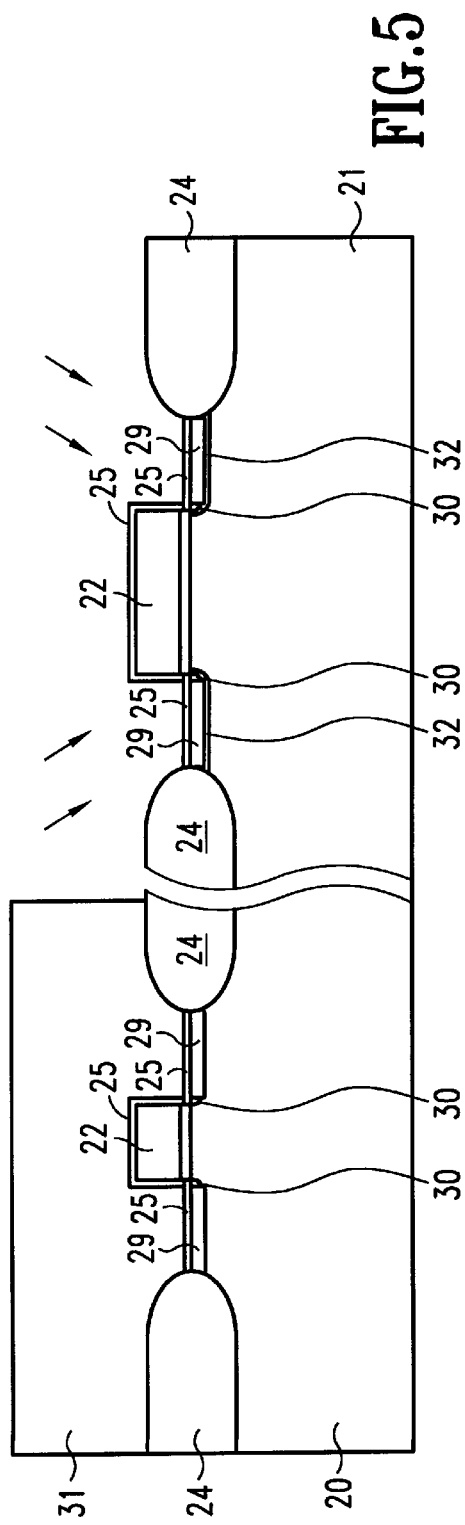
FIG. 5 is a cross-sectional view of forming a photoresist layer on the functional region and co-implanting $As^+$ and $P^+$ ions into the ESD protective region according to the present invention.

A method for forming a self-aligned silicide short-channel (MOSFET and an ESD protective structure in a meantime is provided in the present invention. The detailed processes will be described as follows.

FIG. 1 shows a cross-sectional view of two distinctive regions, a functional region 20 and an ESD protective region 21 on a <001> orientation boron doped single crystal silicon substrate. Each region is formed with at least one defined poly-gate structure 22, thereby defining the active 23 regions (the positions are indicated by an arrow). In the figure, the isolation regions 24 isolate the active region of the functional region 20 from the ESD protective region 21. The ESD protective region 21 can be far away from or adjacent to the functional region 20. The method for patterning the poly-gate structure 22 on regions 23, and forming isolation regions 24 is known in the art, therefore, no unnecessary details are given.

FIG. 2 shows an insulating layer formed on the surface of the active regions 23 and the poly-gate structure 22 of the substrate. Preferably, the insulating layer 25 is an oxynitride layer formed by an annealing process in $N_2O$ and/or NO ambient so as to recover the etching damage resulting from poly-gate formation.

Referring to FIG. 3, for suppressing the hot carrier effect, a lightly doped drain implant is performed into the resulting surface to form lightly doped drain regions in the functional region 20 and in the ESD protective region 21. The $As^+$ or $P^+$ ion is selected as an ion species during the implantation. The conditions of implantation energy are about 5 keV to 100 keV, to a dose of about $5\times10^{12}$–$1\times10^{14}$/cm$^2$.

Referring to FIG. 4, for suppressing the short channel effect off-set in the functional region 20, a large angle tilted pocked anti-punchthrough implant (in the directions indicated by arrows) is provided to form anti-punchthrough regions 30 beneath the poly-gates 22. Preferably, the ion species is selected from $B^+$ or $BF_2^+$, and the conditions of the implantation are carried out by an energy of about 20–120 keV, to a dose of about $5\times10^{11}$–$1\times10^{13}$/cm$^2$. The tilted angle is about 10–60°.

After that, and referring to FIG. 5, a photoresist 31 is masked via a lithography process on the area of the functional region 20. Two ion species selected from the group of arsenic, antimony and phosphorus ions are co-implanted into the ESD protective region 21 forming doped regions 32. The regions 32 are for the purpose of forming double diffused drain junctions. The energy and the dosage for $As^+$ ion implantation are about 5 keV to 150 keV and $5\times10^{14}$/cm$^2$ to $5\times10^{15}$/cm$^2$, and for $P^+$ are about 5 keV to 150 keV and $2\times10^{14}$/cm$^2$ to $2\times10^{15}$/cm$^2$, respectively. It is noted that the concentration of n-type conductive ions is larger than the anti-punchthrough implantation so that DDD junction instead of anti-punchthrough region can be formed during a high temperature annealing.

Figure 6:
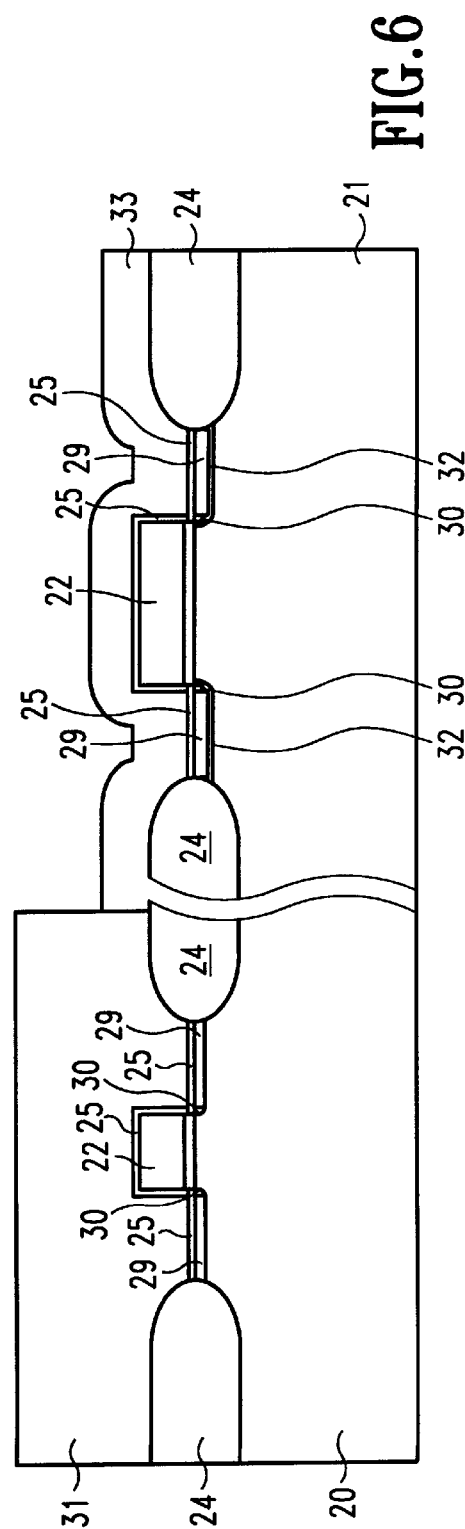
FIG. 6 is a cross-sectional view of forming a LPD oxide on the ESD protective region using the photoresist as a mask.

Next, a liquid phase deposition (LPD) oxide 33 overlaying all areas of the ESD protective region 21 is grown; The LPD oxidation is conducted at a temperature of about 25 to 300° C., to a thickness of about 50 nm to 300 nm as shown in FIG. 6. It is worth noting that the LPD oxide will, thereafter, serve as an effective mask in the subsequent steps for fabricating the functional region 20.

Figure 7:
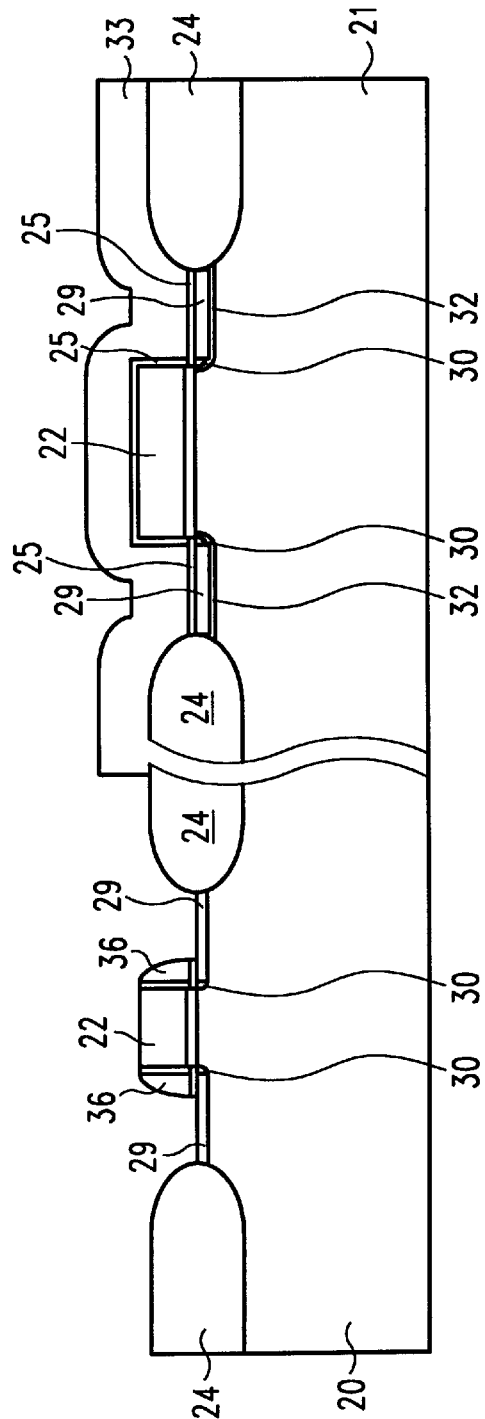
FIG. 7 is a cross-sectional view of forming sidewall oxide spacers on the poly-gate of the functional region according to the present invention.

Referring to FIG. 7, after stripping the photoresist layer 31, a dielectric layer (not shown) is deposited over all the surfaces, including the isolation regions 24, the poly-Si gate 22 and the substrate of the functional region 20. The dielectric layer is formed by a CVD method to a thickness of about 50 nm to 200 nm. Then an anisotropic etching is performed to form dielectric sidewall spacers 36 on the sidewalls of the poly-gate 22 in the functional region 20. In a preferred embodiment the dielectric sidewall spacers 36 are a silicon oxide or a silicon nitride.

Figure 8:
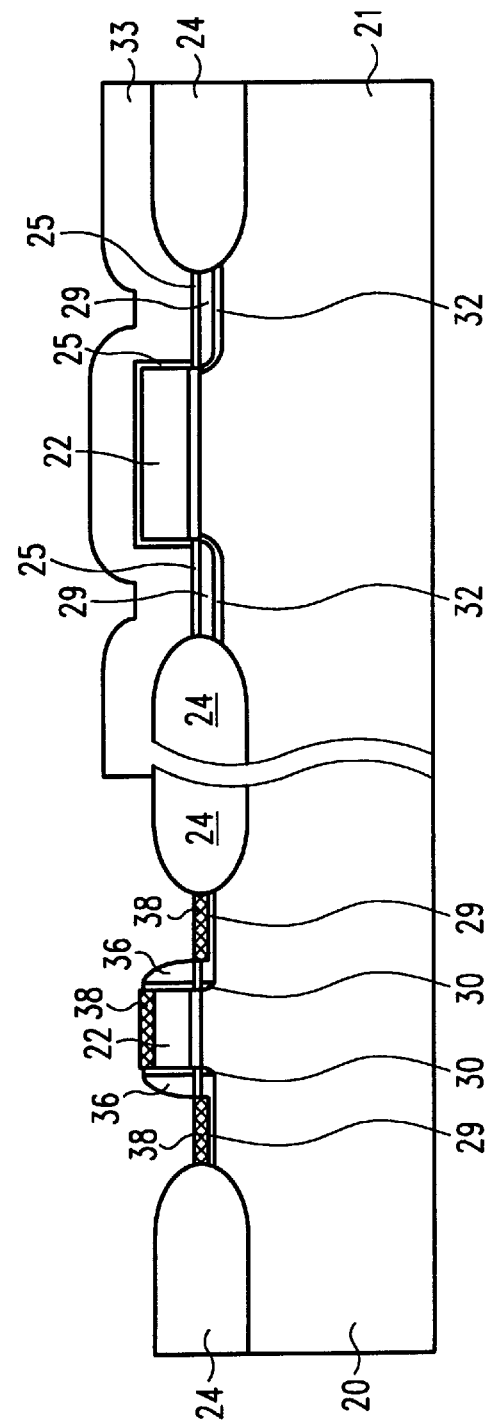
FIG. 8 is a cross-sectional view of forming a self-aligned silicide on S/D region, poly-gate of the functional region according to the present invention.

Referring to FIG. 8, in order to form salicide contacts, a metal layer (not shown) selected from the group consisting of Ti, Co, Ni, and W is deposited on all areas. The method of deposition can be carried out either by a CVD or by a sputtering process to about 10 nm to 100 nm in thickness.

Then, a first-step of silicidation process at a temperature of about 350° C. to 750° C. in nitrogen ambient by a rapid thermal process (RTP) is implemented. In addition, the p-type conductive dopants 30 during the antipunchthrough implant are compensated by the n-type conductive ions in the ESD protective region 21.

Still referring to FIG. 8, the metal layer reacts with the poly-Si of the poly-gate 22 in the functional region 20 so that a self-aligned silicide layer 38 is formed on the top surface of the poly-gate 22. At the same time, the silicide layer 38 is also formed on the source/drain regions 23 by consuming a portion of silicon substrate layer. Some of the unreacted metal layers (on the isolation region 24, the spacer 36 and the LPD oxide 33) are then selectively removed through the use of an etchant that does not attack the silicide, the silicon substrate, or the $SiO_2$. Preferably the unreacted metal layers are etched away by a wet etching which is a solution containing $NH_4OH$, $H_2O$ and $H_2O_2$.

Figure 9:
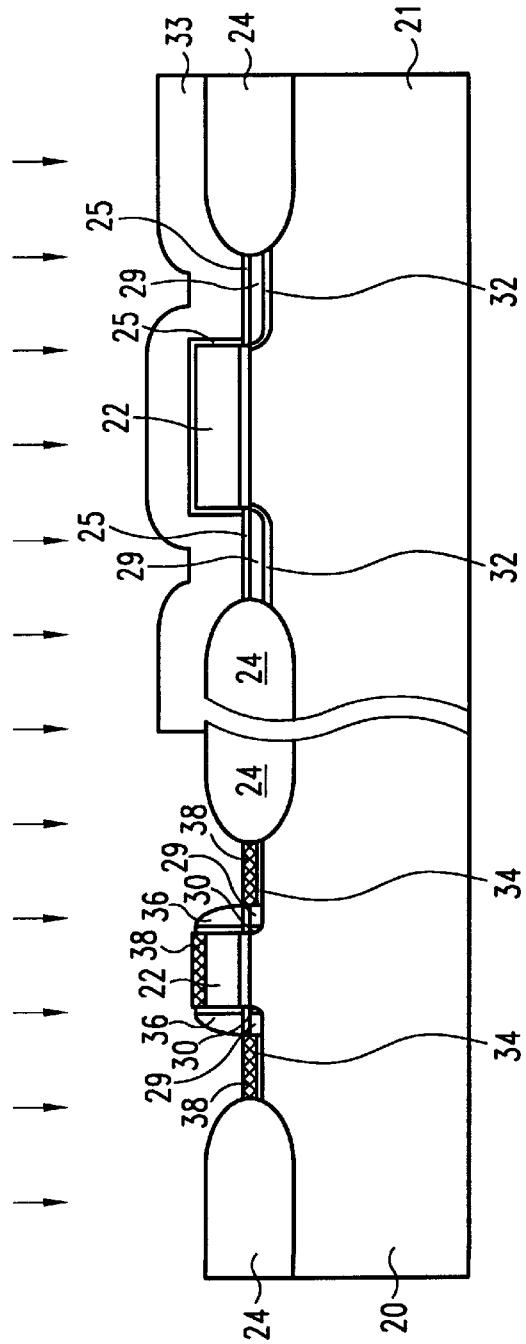
FIG. 9 is a cross-sectional view of performing a low energy high dose S/D drain implant into the silicide layer according to the present invention.

Referring to FIG. 9, a high dose, low energy arsenic or phosphorus ions (arsenic is generally prefer) is selected to implant into the silicide layers 38 on the top of the gate 22 and the source/drain regions 23. Preferably, an energy of about 5 keV to 100 keV to a dose of about $5\times10^{14}/cm^2$–$5\times10^{16}/cm^2$ of the ion implantation is performed. For a heavy mass of arsenic ions and the lower implanted energy, the spacer oxide and the isolation oxide are employed as an effective mask, and obstruct the ions from penetrating into such regions.

Figure 10:
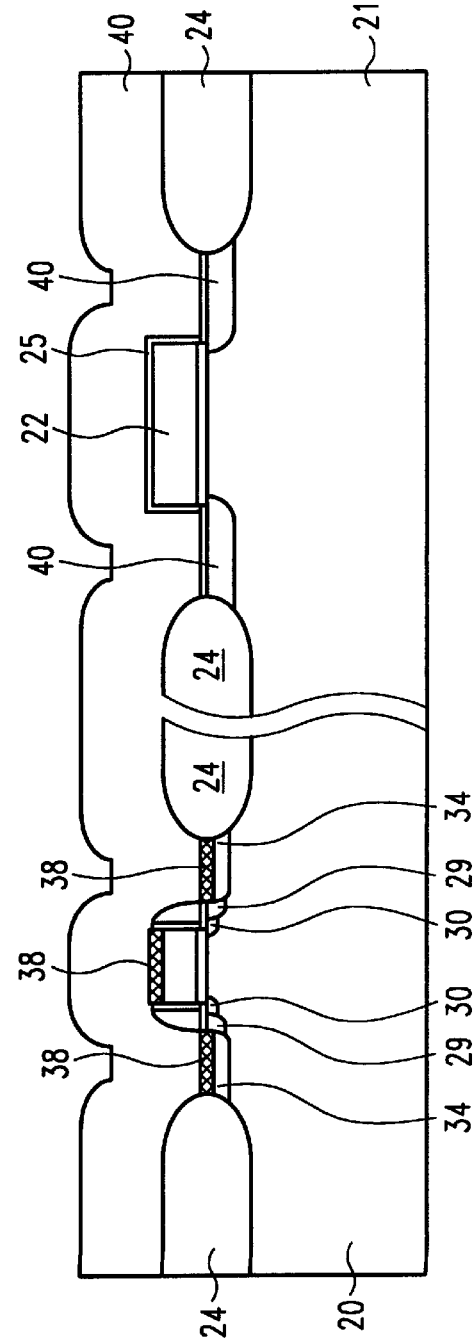
FIG. 10 is a cross-sectional view of forming a thick CVD oxide on all surfaces then performing a high temperature annealing as to form, an ultra-shallow junction in the functional region and a double diffusion drain junction in the ESD protective region according to the present invention.

As shown in FIG. 10, a thick and continuous CVD oxide layer 40 is deposited on the top surface of the functional region 20 and the ESD protective regions 21. Preferably, the thickness of the oxide layer is about 100–800 nm at a temperature of about 500–800° C. Next a thermal process at high temperature is implemented. The doping impurities in silicide layers will serve as a diffusion source, and will be driven into the substrate and the poly-gate 22, and ultra-shallow source/drain junctions 34 are formed. The function depth of source/drain is determined by the redistribution of impurity ions, i.e., the thermal process. Further, the silicide formed during annealing will be transformed to a stable phase having a lower sheet resistance. Taking $TiSi_2$ silicide as an example, the first RTP is done at 580–680° C. and a second RTP is done at a temperature higher than 750° C. The second RTP transforms the meatball C-49 $TiSi_2$ to the low resistivity C-54 $TiSi_2$ (orthogonal phase). At the same time, the DDD junctions 40 are formed in the ESD protective region 21. Furthermore, the impurity ions in the substrate and the poly-Si gate 22 will be activated, and the damage caused by ion implantation will be recovered after the aforementioned thermal process. In a preferred embodiment, a second-step of RTP is performed at a temperature of about 700° C. to 1150° C. for 5 to 180 s.

The benefits of this invention include:
(1) ultra-shallow junctions with self-aligned silicide contacts in the functional devices could be obtained by using the silicide layers as a diffusion source (see the reference;)
(2) the circuit operation speed and the short channel effect in the functional devices could be significantly improved; and
(3) the high protection voltage could be obtained by using the double drain (DDD) junction.

As is understood by a person skilled in the art, the foregoing preferred embodiment of the present invention is an illustration of the present invention rather than a limitation thereon. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention. For example, we proposed that for fabricating short-channel nMOSFETs (for nMOSFETs, n-type conductive ion is used to form $N^+p$ junction), however, the invention also can utilized to fabricate pMOSFETs with ESD protective transistor. (For pMOSFETs, p-type conductive ion is used to form $p^+n$ junction. For example, this can be done by $BF_2^+$ ion implantation to form LDD, $AS^+$ ion implant to form anti-punchthrough region and finally $BF_2^+$ ion implantation to form S/D implant.)

What is claimed is:

1. A method for fabricating a MOS transistor and an ESD protective transistor in a silicon substrate, said method comprising the steps of:

providing an isolation region in said silicon substrate, said isolation region separating a functional region which has a first poly-gate for forming said MOS transistor from an ESD protective region which has a second poly-gate for forming said ESD protective transistor;

forming a first insulating layer on all resulting surfaces;

performing a first ion implantation to all resulting surfaces using first conductive ions so as to form a first lightly doped drain region in said functional region and to form a second lightly doped drain region in said ESD protective region;

performing a second ion implantation with a tilted angle to all resulting surfaces using second conductive ions so as to form a first anti-punchthrough region beneath said first poly-gate and to form a second anti-punchthrough region beneath said second poly-gate, said second conductive ions having an opposite electrical conductivity to said first conductive ions;

masking said functional region utilizing a photoresist layer;

performing a third ion implantation with a tilted angle to said ESD protective region using two kinds of said first conductive ions co-implanted so as to form a doped region beneath said second poly-gate;

forming a second insulating layer on said ESD protective region using said photoresist layer as a mask;

removing said photoresist layer;

forming dielectric spacers on sidewalls of said first poly-gate and on a portion of first lightly doped drain region using said second insulating layer as an mask so that a remnant of said lightly doped drain region serves as first source/drain region;

forming a self-aligned silicide layer on said first poly-gate and said first source/drain region;

performing a fourth ion implantation to all resulting surfaces so as to form said first source/drain region in said functional region using said second insulating layer as a mask;

forming a third insulating layer on all resulting surface; and performing a thermal annealing to said substrate so as to form ultra-shallow junctions in said functional region and DDD junctions in said ESD protective region.

2. The method of claim 1, wherein said first insulating layer is an oxynitride layer.

3. The method of claim 1, wherein said first conductive ions are selected from the group consisting of arsenic, phosphorus and antimony for forming a NMOS transistor.

4. The method of claim 1, wherein said first conductive ions are selected from the group consisting of boron, $BF_2^+$ for forming a PMOS transistor.

5. The method of claim 1, wherein said step of performing first ion implantation uses an energy of about 5 keV to 100 keV and a dose of about $5\times10^{12}/cm^2$ to $1\times10^{14}/cm^2$.

6. The method of claim 1, wherein said second conductive ions are selected from the group consisting of arsenic, phosphorus and antimony for forming a PMOS transistor.

7. The method of claim 1, wherein said second conductive ions are selected from the group consisting of boron, $BF_2^+$ for forming a NMOS transistor.

8. The method of claim 1, wherein said step of performing second ion implantation uses an energy of about 20–120 keV, a dose of about $5\times10^{11}$–$1\times10^{13}/cm^2$ or less, and said tilted angle is about 10–60°.

9. The method of claim 1 wherein said second insulating layer is formed by a method of liquid phase oxide deposited technology at a temperature of about 25 to 300° C. and to a thickness of about 500 to 3000 angstroms.

10. The method of claim 1, wherein said doped region beneath said second poly-gate has a larger ion concentration than said second anti-punchthrough region in said ESD protective region.

11. The method of claim 1, wherein said step of performing a third ion implantation is to form a double diffused drain junction in said ESD protective region.

12. The method of claim 1, wherein said two kinds of said first conductive ions are phosphorus ions and arsenic ions, said co-implant, for phosphorus ions, using an energy of about 5 keV to 150 keV and a dose of about $2\times10^{14}/cm^2$ to $2\times10^{15}/cm^2$ and for arsenic ions, using an energy of about 5 keV to 150 keV and a dose of about $5\times10^{14}/cm^2$ to $5\times10^{15}$.

13. The method of claim 1, wherein said dielectric spacers are selected a material consisting of oxide spacers and nitride spacers.

14. The method of claim 1, wherein said step of forming a self-aligned silicide comprises:

forming a metal layer on said dielectric spacers, said first poly-gate and said second insulating layer;

performing a silicidation annealing so that a silicide layer is formed on said source/drain and said first poly-gate; and etching away any unreacted metal layer which is on said dielectric spacers, said isolation regions and said second insulating layer.

15. The method of claim 14, wherein said metal layer is comprised of a metal selected from the group consisting of Ti, Co, Ni and W.

16. The method of claim 14, wherein said step of silicidation annealing is performed by a RTP process at a temperature of about 350° C. to 700° C. in nitrogen ambient.

17. The method of claim 1, wherein said step of third insulting layer is an oxide layer with a thickness of about 100 nm to 800 nm.

18. The method of claim 1, wherein said second step of thermal annealing is performed by a RTP process at a temperature of about 700° C. to 1150° C. in nitrogen ambient.

* * * * *